United States Patent
Frisa et al.

(10) Patent No.: US 6,786,222 B2
(45) Date of Patent: Sep. 7, 2004

(54) METHOD FOR REMOVING PARTICLES FROM A SEMICONDUCTOR PROCESSING TOOL

(75) Inventors: Larry E. Frisa, Meiningen (DE); Scott S. Kellogg, San Antonio, TX (US); Grant W. McEwan, Austin, TX (US); Michael N. Montgomery, Round Rock, TX (US); Iraj Eric Shahvandi, Round Rock, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/280,629

(22) Filed: Oct. 25, 2002

(65) Prior Publication Data

US 2004/0079385 A1 Apr. 29, 2004

(51) Int. Cl.[7] ................................................ B08B 6/00
(52) U.S. Cl. ................................. 134/1.3; 134/1; 134/6; 134/37; 134/902; 15/1.52
(58) Field of Search .............................. 134/1, 37, 902, 134/1.3; 15/1.52

(56) References Cited

U.S. PATENT DOCUMENTS

| 5,225,000 A | * | 7/1993 | Fujii et al. | 134/1 |
| 6,159,421 A | * | 12/2000 | Fujii | 422/4 |

FOREIGN PATENT DOCUMENTS

EP      0790 642 A2   *   8/1997

* cited by examiner

Primary Examiner—Zeinab El-Arini
(74) Attorney, Agent, or Firm—Kim-Marie Vo

(57) ABSTRACT

A method for removing particles from a semiconductor processing tool is provided. The method comprises providing a pick-up wafer for picking up particles from a semiconductor processing tool, inserting said pick-up wafer into said semiconductor processing tool and placing the pick-up wafer on a receiving member, applying an electrostatic charge to said pick-up wafer, leaving said pick-up wafer in said semiconductor processing tool for a predetermined dwell time; and removing said pick-up wafer from said semiconductor processing tool. Further, a method for processing semiconductor wafers is provided.

21 Claims, 3 Drawing Sheets

METHOD FOR REMOVING PARTICLES FROM A SEMICONDUCTOR PROCESSING TOOL

FIELD OF THE INVENTION

The present invention generally relates to a method for removing particles from a semiconductor processing tool. The present invention is particularly applicable to processing tools used to fabricate semiconductor devices containing submicron design features, and to processing tools used in processing large diameter wafers, such as an eight (8) inch (200 mm) or twelve (12) inch (300 mm) wafers.

BACKGROUND OF THE INVENTION

In the fabrication of semiconductor devices, wafers are typically processed through a large number of different processing stations, including processing tools where the wafer is coated with resist or developed, as well as chemical vapor deposition (CVD), physical vapor deposition (PVD), implant, etch and lithography processing tools. As the wafers run through the different tools, particles which are present on the susceptors and other wafer handling equipment of the semiconductor processing tools can accumulate on the backsides of the wafers. Often, a high number of particles is found within such semiconductor processing tools.

Backside particles may cause problems in subsequent processing steps, including lithography or other imaging steps, where depth of focus is a critical issue. The particles on the backside of a wafer may cause the wafer to deform beyond the depth of focus as a vacuum is applied to the chuck holding the wafer. As a result, focus spots appear in the lithography step which contribute to reducing the process yield.

The problems associated with backside particles on semiconductor wafers become more pronounced as the design features of the fabricated semiconductor devices become smaller, and as the wafer being processed become larger. As the dimensions of conductive lines and interline spacings become less than about 0.25 $\mu$m, particularly less than about 0.2 $\mu$m, the ability of lithographic equipment to fulfill the stringent requirement with satisfactory accuracy in the presence of a large number of backside particles is increasingly reduced.

Additionally, serious problems arise for wafers with a large diameter such as 12 inch (300 mm) wafers. Due to the large size of the wafers the presence of backside particles results in an increased deformation and requires thus an increased clamping force in steppers.

While being most easily identified in lithography steps, backside particles may also cause problems in other processing steps. For example, particles may be transferred from one wafer to another, until they are transferred out of the initial processing tool into a processing tool that is sensitive to contamination, such as a diffusion furnace. Also, a nonuniform etch or deposition may arise in plasma processing steps due to temperature differences across the deformed wafer.

One prior art attempt to deal with the backside particle problem is disclosed in U.S. Pat. No. 5,780,204 to La et al. To improve the accuracy of photolithographic processing, La suggests to polish the backside of the wafers prior to the photolithography step by chemical-mechanical (CMP) polishing. Thereby a wafer backside with a suitable wafer flatness could be attained. However, for satisfactory results, this method requires that a polishing step on the wafer backside is performed for each processed wafer prior to each lithography step and particularly, subsequent to the deposition of a dielectric layer on the front side of the wafer. Thus a large number of polishing steps needs to be performed, especially if other processing steps which have problems with backside particles are to be treated in the same manner. Another disadvantage of frequent CMP polishing is that exposed films absorb moisture ($H_2O$) from processing which degrades the properties of the film.

U.S. Pat. No. 5,966,635 to Hiatt et al. discloses another prior art attempt to solve the backside particle problem. Hiatt suggests that after coating a wafer with resist or after developing resist the wafer should be removed from the chuck, and the chuck be cleaned by dispensing a solvent such as EGMEA or PGMEA to improve precision and uniformity in subsequent operations. Further, a sponge which is at least partially saturated with a solvent may be moved across the chuck to remove particles.

In a further prior art solution, disclosed in WO 99/59201, it is suggested to use a smoother chuck with a surface finishing having a peak-to-valley roughness height with an average value of less than about 1000 Å, which reduces the particle formation during wafer loading or unloading. Such a specially designed chuck is more expensive than ordinary chucks and the highly polished surface is likely to become degraded over time by scratches and other surface damages.

In practice, wafers are often merely brushed clean before the lithography step.

A common cleaning method is to remove the particles from a semiconductor processing tool by cycling a large number of wafers (10 to 100 wafers) through the tool. A certain number of particles adheres to each cleaning wafer thereby reducing the number of particles remaining in the processing tool. However, this approach requires a large number of non-productive wafers used for cleaning purposes only, requires considerable storage capacity for the cleaning wafers and results in a significant down time of the tool.

Therefore, the present invention seeks to solve the above mentioned problems and shortcomings of the prior art and intends to provide an efficient method for removing particles from a semiconductor processing tool, thereby increasing the availability of the tool and reducing the nonproductive time required for cleaning. Further, the invention intends to provide an improved method for processing semiconductor wafers in which less effort and time needs to be directed to cleaning or removing backside particles from the process wafers, to increase the productivity and the yield of the manufacturing process.

DETAILED DESCRIPTION OF A PREFERRED EMBODIMENT

Figure 1:
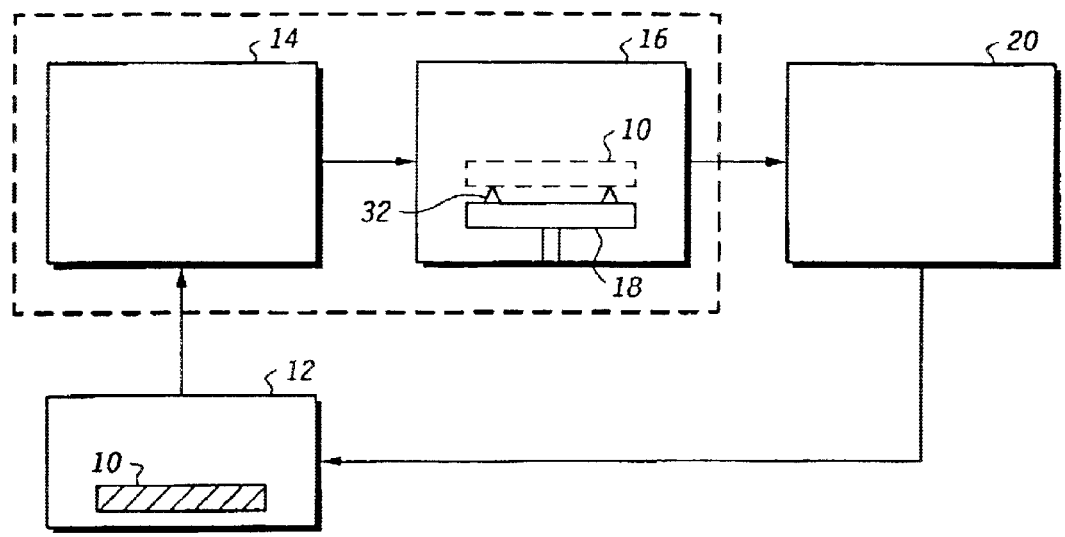
FIG. 1 is a block diagram illustrating a cycle of removing particles from a semiconductor processing tool using a method according to the invention.

According to the invention, a method for removing particles from a semiconductor processing tool is provided, which includes:

providing a pick-up wafer for picking up particles from a semiconductor processing tool 16;

inserting said pick-up wafer into said semiconductor processing tool and placing the pick-up wafer 10 on a receiving member;

applying an electrostatic charge to said pick-up wafer;

leaving said charged pick-up wafer in said semiconductor processing tool 16 for a predetermined dwell time; and removing said pick-up wafer from said semiconductor processing tool after the predetermined dwell time.

By applying an electrostatic charge to the pick-up wafer, the wafer attracts more particles than a conventional cleaning wafer. Therefore, particles are more efficiently removed from the processing tool 16 and less dedicated cleaning wafers are required. Additionally, the charged wafer holds the particles longer, so that they can safely be taken out of the processing tool together with the pick-up wafer. The possibility of spreading particles throughout the system is thus greatly reduced. Further, the charged pick-up wafer collects not only particles that touch the wafer as is the case for a conventional cleaning wafer. Rather, the electrostatic charge of the pick-up wafer also attracts particles hovering in the processing tool that come fairly close to the wafer. Due to its efficient particle collection the method according to the invention makes fewer non-productive cleaning wafers necessary and requires thus less storage space as well as less time to regenerate the cleaning wafers. The tool down time can be significantly reduced and hence the productivity of the processing tool increased.

In one embodiment the step of applying an electrostatic charge includes inserting a pick-up wafer into a separate electric charge generating station, generating electric charges impinging on the pick-up wafer) in the separate electric charge generating station, thereby applying an electrostatic charge to said pick-up wafer, and transferring the charged pick-up wafer to the said semiconductor processing tool.

In another embodiment of the invention, the electrostatic charge is applied to a pick-up wafer by inserting the pick-up wafer into a wafer charging station, and generating therein electric charges impinging on the pick-up wafer, whereby an electrostatic charge is applied to the pick-up wafer. The wafer charging station and the processing tool may be parts of the same tool or even parts of the same chamber.

In a yet another embodiment, the receiving member is an electrostatic chuck and an electrostatic charge is applied to said pick-up wafer by applying a voltage to said electrostatic chuck. Especially, a pulsed voltage may be applied to said electrostatic chuck so as to break particles free from said chuck and to attract them to the pick-up wafer or to repel them from a processing area of the processing tool.

In a different embodiment, the electrostatic charge is applied to said pick-up wafer by applying a voltage to handling equipment within the processing tool, such as pins that lift wafers off a robot blade and lower them on the chamber's pedestal.

As a skilled artisan recognizes, other external processes may be used to induce an electrostatic charge on said pick-up wafer 10, such as a rotating magnetic field as in a PVD chamber, or a coil, as in etch, sputter clean, or ion metal plasma (IMP) PVD chambers. Such charging schemes are especially useful when the pick-up wafer has a capacitor construction, which is susceptible to be damaged by the operation of a plasma.

The invention provides further a method for processing semiconductor wafers, which includes:

providing a semiconductor processing tool;

processing semiconductor wafers in said semiconductor processing tool up to a predetermined limit;

removing particles from said semiconductor processing tool by providing a pick-up wafer for picking up particles from said semiconductor processing tool;

inserting said pick-up wafer into said semiconductor processing tool and placing the pick-up wafer on a receiving member;

applying an electrostatic charge to said pick-up wafer, leaving said pick-up wafer in said semiconductor processing tool for a predetermined dwell time, removing said pick-up wafer from said semiconductor processing tool; and repeating the steps of processing semiconductor wafers and removing particles as desired.

These and other features and advantages will be more clearly understood from the following detailed description taken in conjunction with the accompanying drawings.

FIG. 1 is a block diagram illustrating a cycle of removing particles from a semiconductor processing tool 16 using a method according to the invention. A storage container 12 contains several dedicated pick-up wafers 10 only one of which is shown in the schematic illustration of FIG. 1. Also shown in FIG. 1 is a wafer charging station 14 and a cleaning station 20 for stripping collected particles from the pick-up wafers 10. The semiconductor processing tool 16 comprises in addition to other wafer handling and processing equipment (not shown) a receiving member 18 for a wafer such as a pedestal or a susceptor. Particles can be removed from wafer handling and transportation equipment as well as from a pedestal. The wafer charging station 14 and the semiconductor processing tool 16 may be parts of the same tool or even parts of the same chamber as indicated by the broken line in FIG. 1.

Figure 2:
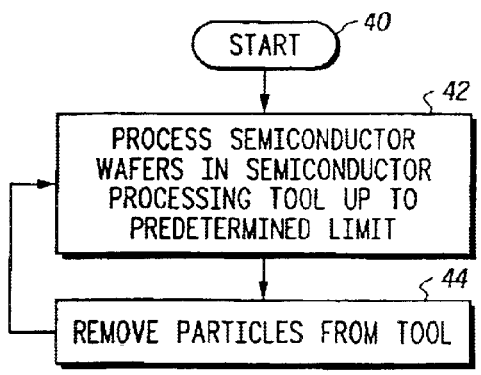
FIG. 2 is a process flow diagram illustrating a preferred embodiment of a method for processing semiconductor wafers according to the invention.
Figure 3:
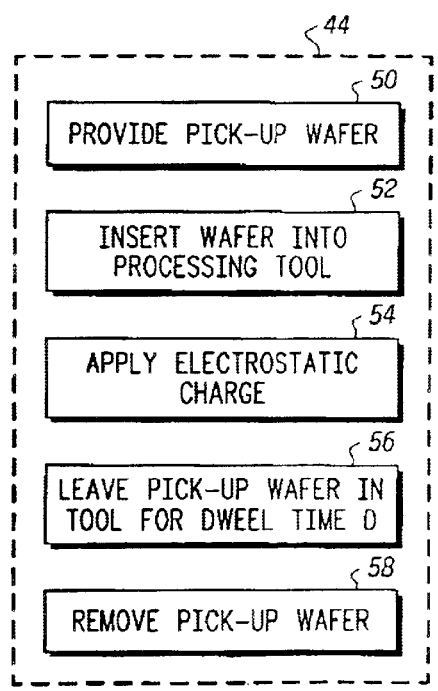
FIG. 3 is a flow diagram illustrating a preferred embodiment of a method for removing particles from a semiconductor processing tool according to the invention.

In the following, the method for processing semiconductor wafers and particularly, the method for removing particles from a semiconductor processing tool illustrated in FIG. 1 is described in detail with reference to FIGS. 2 and 3. After starting the method at 40, semiconductor wafers are processed in the semiconductor processing tool 16 in step 42. The processing tool 16 may be any of a wide variety of processing stations including a PVD station, CVD station, or an etch station. Processing of wafers in the processing tool 16 occurs for a predetermined limit. The predetermined limit may be fixed by a regular cleaning interval and can be defined in terms of the number of wafers processed in the processing tool in sequence, or in terms of the time that has lapsed since the last step of removing particles from the processing tool. If the predetermined limit has been reached, the method proceeds to step 44, where a step of removing particles form the processing tool is carried out as described below in greater detail.

After particles have been removed from the tool, the method returns to step 42, and another sequence of processing semiconductor wafers in the processing tool 16 is started. Again, when the predetermined limit is reached a further step 44 of removing particles is executed.

For example, particles may be removed from the processing tool 16 every lot of wafers, wherein a lot contains between thirteen and twenty-five wafers. It will be appreciated that the interval in which particles are removed depends on the nature of the processing tool. Tools such as a CVD chamber, in which a larger number of particles are generated require more frequent cleaning.

Next, the basic particle removing operation 44 is described with reference to FIG. 3. In a first step 50, a pick-up wafer 10 for picking up particles from the semiconductor processing tool 16 is provided. The method proceeds to step 52, the pick-up wafer 10 is inserted into the semiconductor processing tool 16. Then, in step 54, an electrostatic charge is applied to the pick-up wafer 10, and it is left for a predetermined dwell time D (step 56) sufficiently long for particles to stick and adhere to the pick-up wafer 10. The method then proceeds to step 58, in which the pick-up wafer together with the attached particles is removed from the processing tool 16.

Figure 4:
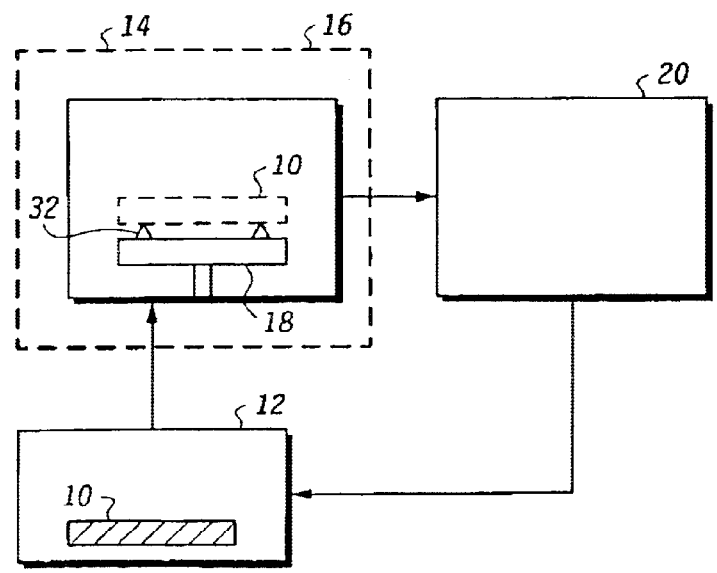
FIG. 4 is a block diagram illustrating a cycle of removing particles from a semiconductor processing tool using a further method according to the invention.

An embodiment in which the wafer charging station 14 and the semiconductor processing tool 16 are parts of the same chamber is shown in FIG. 4. The remaining equipment is similar to the embodiment according to FIG. 1; thus it is referred to the description thereof.

Figure 5:
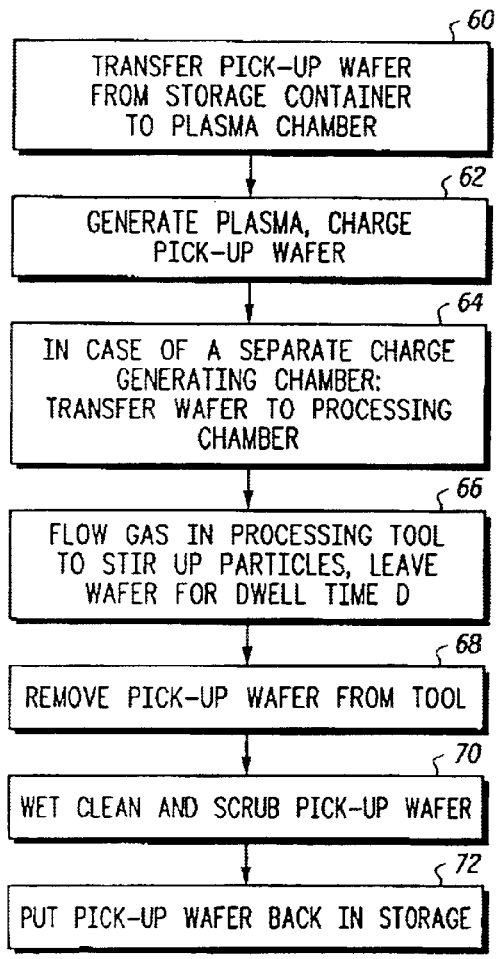
FIG. 5 is a flow diagram illustrating another preferred embodiment of a method for removing particles from a semiconductor processing tool according to the invention.

In another embodiment, the tools of FIG. 4 are used. Such a method of the particle removing operation is illustrated in FIG. 5. Beginning at step 60, the pick-up wafer 10 for picking up particles from the processing tool 16 is transferred from the storage container 12 to the plasma generating chamber 14, which may be, for example, a plasma enhanced chemical vapor deposition (PECVD), PVD, ash or etch chamber. Instead of a plasma generating chamber, any chamber which generates charged particles, such as an ion implanter may also be used.

In step 62, a plasma is generated in the plasma-generating chamber 14, whereby charged ions are produced which impinge on the pick-up wafer 10. In one embodiment, plasma guns in the plasma chamber can be used to charge the pick-up wafer 10. The generation of a plasma and the application of a DC voltage to direct charged ions to the pick-up wafer is know to a skilled artisan and therefore, is not described in greater detail.

Proceeding to step 64, if the plasma generating chamber 14 is not the chamber to be cleaned, then the pick-up wafer 10 is taken out of the plasma generating chamber 14 and transferred to the processing tool 16 to be cleaned, where it is placed on the susceptor 18. As described above in connection with the method of FIG. 2, the wafer is left in the processing tool for a certain dwell time D.

It is worth noting that the pick-up wafer 10 may, but need not touch the surface of the receiving member 18 to remove particles. For example, as shown in FIG. 1, lift pins 32 that lift wafers off a robot blade (not shown) and lower them on the receiving member 18 could position the pick-up wafer 10 closely to the receiving member's top surface.

Additionally, during the dwell time D, an inert gas such as Ar flows through the processing tool to stir up any particles which may sit on chamber walls or other pieces of wafer handling equipment of the processing tool 16. If these particles come close to the wafer they are attracted by the electrostatically charged pick-up wafer 10 much like dust particles are attracted to an electrostatically charged TV screen. The charge also ensures that the particles stick quite tightly to the pick-up wafer 10 so that they can be removed together with the wafer 10 in step 68, in which the wafer is retracted from the processing tool 16.

To be able to use the pick-up wafer 10 for further cleaning steps, the pick-up wafer itself is cleaned in a cleaning station 20, applying a wet clean and scrubbing process (step 70). Lastly, in a step 72, the pick-up wafer 10 is put back into the storage container 12 where it awaits a further particle removing cycle.

While a standard silicon wafer may be used as a pickup wafer in the above described methods, it is preferred that specially designed pick-up wafers 10 capable of holding a large amount of charge are utilized. In particular, a pick-up wafer with a first and second surface, whereby at least one of the first and second surfaces is covered with a dielectric layer can be used. Also, at least one of the first and second surfaces may be covered with a metal layer. The pick-up wafer may further contain a metal layer covered with a dielectric layer. A preferred pick-up wafer is patterned such that it contains at least one metal layer and at least one dielectric layer to form a parallel plate capacitor within the patterned wafer.

Figure 6A:
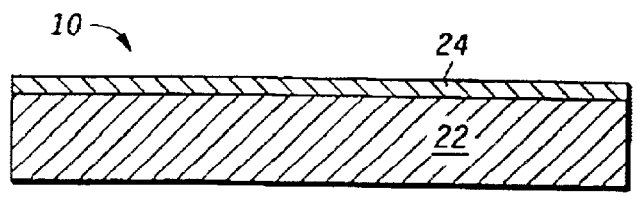
FIG. 6 shows in (a) to (c) three embodiments of pickup wafers useful in practicing the invention.
Figure 6B:
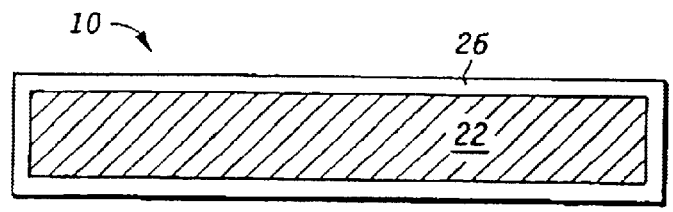
Figure 6C:
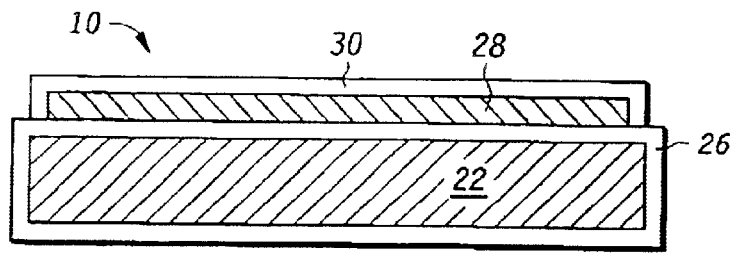

FIG. 6 shows in (a) to (c) three examples of pick-up wafers 10 useful in practicing the invention. It should be appreciated that other pick-up wafer designs that are capable of holding an electrostatic charge such as a ceramic disk may also be used together in the method according to the invention. The pick-up wafer 10 of FIG. 6(a) comprises a silicon substrate 22 with a metal layer 24 deposited on the upper surface of the silicon substrate 22. FIG. 6(b) shows another example, in which a silicon substrate 22 is thermally oxidized to form an $SiO_2$ layer 26 covering the silicon substrate 22, the $SiO_2$ layer 26 having a thickness of, for example, 100 nm. Already a pick-up wafer with such simple structure has been found to provide significantly improved particle collection properties as described in more detailed below. A more sophisticated design is illustrated in FIG. 6(c). A silicon substrate 22 is thermally oxidized to form a $SiO_2$ layer 26. Then, a 600 nm thick metal layer 28 of AlCu is deposited on the thermal oxide, and a 80 nm thick oxide layer 30 of $SiO_2$ formed using TEOS (tetraethylorthosilicate) is deposited on top of the metal layer 28 to form a capacitor structure within the pick-up wafer. It should be understood that the above thickness values and materials are mentioned by way of example only, and that other thickness values and materials having similar properties to those described are intended to be within the scope of the present invention.

To pick up wafers on the chuck and wafer handling equipment, the wafer may need to be placed face down, that is with the metal layer 24 of FIG. 6(a) or the patterned structure of FIG. 6(c) facing down.

Figure 7:
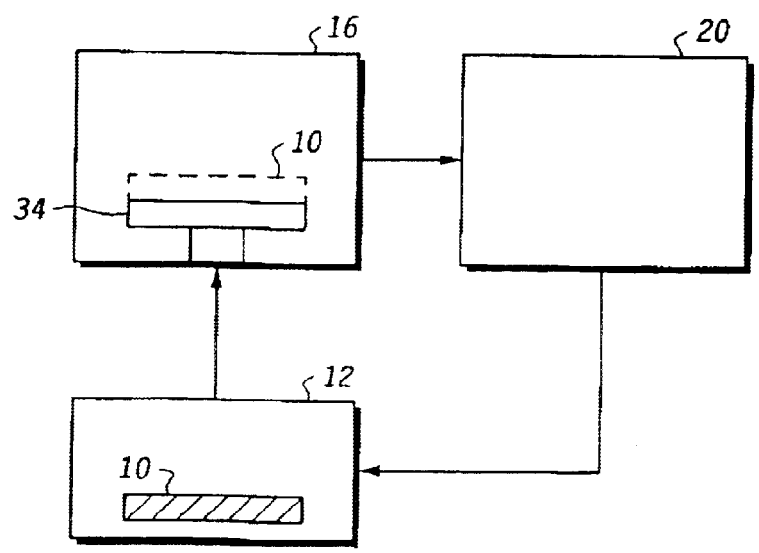
FIG. 7 is a block diagram illustrating a cycle of removing particles from a semiconductor processing tool using another method according to the invention.

Another embodiment is described with reference to the block diagram of FIG. 7. In this embodiment, the receiving member is an electrostatic chuck (ESC) 34, and the charged pick-up wafer 10 is used specifically to remove large particles on the ESC 34, which frequently cause product wafers to be clamped and processed incorrectly. Instead of charging the pick-up wafer 10 in a separate plasma generating chamber, the ESC 34 itself is used to apply an electrostatic charge to the pick-up wafer 10 by applying a voltage to said electrostatic chuck 34. Especially, a pulsed voltage may be applied to the ESC 34 so as to break particles free from the chuck 34 and to attract them to the pick-up wafer 10 or to repel them from a processing area of the processing tool 16. It has been found experimentally that by charging a thermal oxide wafer, as described in connection with FIG. 6(b) above, using an electrostatic chuck 34, over three times more particles were removed than with a standard Si cleaning wafer.

EXAMPLE

A silicon substrate was thermally oxidized to form a 100 nm thick $SiO_2$ layer on both sides of the substrate. This thermal oxide layer was used as the pick-up wafer in a 200 mm sputtering system. For comparison, standard cleaning wafers were subjected to the same sequence as the pick-up wafer.

Each wafer was loaded via a load lock into a semiconductor processing system. First, the wafer was brought into a degas/orientation chamber. A standard 40 sec recipe was run in this chamber. Then, the wafer was transferred to an RF sputter chamber system. There, only the pick-up wafer was charged by an Ar plasma for 19 seconds. The standard cleaning wafer was not charged. Next, each wafer was transferred into a PVD chamber used for depositing Ta/TaN. The wafers were placed on the pedestal for 10 seconds. No ESC voltages, gas flow or plasma was applied in the PVD chamber. Then, the wafer was transferred into the cool down station. No cool process was run. Lastly, each wafer was returned to the same load lock where it entered the system. Particles on all wafers were counted before entering and after leaving the processing system through the load lock. Standard wafers were run through the system prior to the first charged wafer and between charged wafers to monitor the baseline for particle counts.

After eliminating first wafer effects, standard wafers (bare silicon) consistently showed an addition of between 250 and 400 particles per run (i.e., the particle count after leaving the load lock was higher by 250 to 400 than the particle count before entering the load lock), which means that each standard wafer removed between 250 and 400 particles from the system.

The thermal oxide pick-up wafer, charged by the Ar plasma as explained above showed an addition of 2000 and 3170 particles, respectively, for two runs. To check for consistency, a pick-up wafer was cycled through the system without charging the wafer in the plasma chamber 14. In this case, an addition of 450 particles was found, approximately the same as for the wafers composed of a bare silicon substrate.

Therefore the plasma charged thermal oxide pick-up wafer collected significantly more particles (by a factor of about 4 to 10) than a standard cleaning wafer.

While the invention has been described in terms of particular structures, devices and methods, those skilled in the art will understand based on the description herein that it is not limited merely to such examples and that the full scope of the invention is properly determined by the claims that follow. For example, since the number of backside particles is proportional to the number of front side particles, the invention may also be used to reduce the baseline of front side particles.

What is claimed is:

1. A method for removing particles from a semiconductor processing tool, comprising the steps of:
    providing a pick-up wafer for picking up particles from a semiconductor processing tool, wherein providing the pick-up wafer comprises providing a patterned wafer containing at least one metal layer and at least one dielectric layer to form at least one parallel plate capacitor within the patterned wafer;
    inserting said pick-up wafer into said semiconductor processing tool and placing the pick-up wafer on a receiving member;
    applying an electrostatic charge to said pick-up wafer;
    leaving said pick-up wafer in said semiconductor processing tool for a predetermined dwell time; and
    removing said pick-up wafer from said semiconductor processing tool after the predetermined dwell time.

2. The method according to claim 1, wherein the step of applying an electrostatic charge comprises the steps of:
    inserting said pick-up wafer into a wafer charging station; and
    generating electric charges impinging on the pick-up wafer, thereby applying an electrostatic charge to said pick-up wafer.

3. The method according to claim 2, wherein said wafer charging station is a plasma generating chamber and the step of generating electric charges comprises generating a plasma in said plasma generating chamber.

4. The method according to claim 2, wherein said wafer charging station is an ion implantation chamber and the step of generating electric charges comprises generating ions impinging on said pick-up wafer.

5. The method according to claim 1, wherein said step of applying an electrostatic charge comprises the steps of:
    inserting said pick-up wafer into a separate electric charge generating station;
    generating electric charges impinging on the pick-up wafer in the separate electric charge generating station, thereby applying an electrostatic charge to said pick-up wafer; and
    transferring the charged pick-up wafer to said semiconductor processing tool.

6. The method according to claim 1, wherein said receiving member is an electrostatic chuck and an electrostatic charge is applied to said pick-up wafer by applying a voltage to said electrostatic chuck.

7. The method according to claim 6, wherein a pulsed voltage is applied to said electrostatic chuck so as to break particles free from said chuck and to attract them to the pick-up wafer or to repel them from a processing area of the processing tool.

8. The method according to claim 1, wherein an electrostatic charge is applied to said pick-up wafer by applying a voltage to handling equipment within the processing tool.

9. The method according to claim 1, wherein an electrostatic charge is induced on said pick-up wafer by a coil or a rotating magnetic field.

10. The method according to claim 1, wherein said step of providing a pick-up wafer comprises providing a wafer with a first and second surface, whereby at least one of the first and second surfaces is covered with a dielectric layer.

11. The method according in claim 1, wherein said step of providing a pick-up wafer comprises providing a wafer with a first and second surface, whereby at least one of the first and second surfaces is covered with a metal layer.

12. The method according to claim 1, wherein said step of providing a pick-up wafer comprises providing a wafer containing a metal layer covered with a dielectric layer.

13. The method according to claim 1, wherein said step of providing a pick-up wafer comprises transferring a pick-up wafer from a storage container to a charge application chamber.

14. The method according to claim 1, wherein said step of providing a pick-up wafer comprises transferring a pick-up wafer from a storage container to said semiconductor processing tool.

15. The method according to claim 1, wherein the step of placing, said pickup wafer is lowered to touch a surface of said receiving member.

16. The method according to claim 1, wherein the step of placing, said pick-up wafer is lowered to a position close to a surface of said receiving member.

17. The method according to claim 1, wherein said step of leaving comprises leaving said pick-up wafer on the receiving member far a dwell time up to 120 sec.

18. The method according to claim 1, wherein said step of leaving said pick-up wafer further comprises flowing a gas through said semiconductor processing tool to stir up particles that are attached to wafer handling equipment, side walls or other members of said semiconductor processing tool.

19. The method according to claim 1, further comprising after the step of removing said pick-up wafer a step of cleaning said pick-up wafer, to allow the pick-up wafer to be used in a further particle pick-up process.

20. The method according to claim 19 wherein said step of cleaning comprises at least one or both of wet cleaning and mechanical cleaning said pick-up wafer.

21. The method according to claim 1, wherein the steps of providing a pick-up wafer, inserting and placing the pick-up wafer on a receiving member, applying an electrostatic charge, leaving and removing said pick-up wafer are repeated several times in succession before the semiconductor processing tool is again used for processing regular wafers.

* * * * *

UNITED STATES PATENT AND TRADEMARK OFFICE
CERTIFICATE OF CORRECTION

PATENT NO. : 6,786,222 B2 Page 1 of 1
DATED : September 7, 2004
INVENTOR(S) : Larry E. Frisa et al.

It is certified that error appears in the above-identified patent and that said Letters Patent is hereby corrected as shown below:

Column 7,
Line 58, change "tool," to -- tool; --.
Lines 58-62, delete "wherein providing the pick-up wafer comprises providing a patterned wafer containing at least one metal layer and at least one dielectric layer to form at least one parallel plate capacitor within the patterned wafer;".

Column 8,
Lines 58-60, claim 13 should read:
-- The method according to claim 1, wherein said step of providing a pick-up wafer comprises providing a patterned wafer containing at least one metal layer and at least one dielectric layer to form at least one parallel plate capacitor within the patterned wafer. --.

Column 9,
Line 6, change "far" to -- for --.

Signed and Sealed this

Twenty-first Day of February, 2006

JON W. DUDAS
*Director of the United States Patent and Trademark Office*